US006246773B1

(12) United States Patent
Eastty

(10) Patent No.: US 6,246,773 B1
(45) Date of Patent: Jun. 12, 2001

(54) AUDIO SIGNAL PROCESSORS

(75) Inventor: Peter Charles Eastty, Eynsham (GB)

(73) Assignee: Sony United Kingdom Limited, Weybridge (GB)

( * ) Notice: Subject to any disclaimer, the term of this patent is extended or adjusted under 35 U.S.C. 154(b) by 0 days.

(21) Appl. No.: 09/164,780

(22) Filed: Oct. 1, 1998

(30) Foreign Application Priority Data

Oct. 2, 1997 (GB) .................................................. 9720962

(51) Int. Cl.[7] ..................................................... H03B 29/00
(52) U.S. Cl. ....................... 381/71.11; 381/119; 381/94.7
(58) Field of Search ................................. 381/71.1, 71.4, 381/71.2, 71.11, 94.1, 94.7, 71.8, 119

(56) References Cited

U.S. PATENT DOCUMENTS 5,377,276 * 12/1994 Terai et al. ........................ 381/71.11
5,724,485 * 3/1998 Rainton .................................. 706/14
5,917,921 * 6/1999 Sasaki et al. ....................... 381/94.1

FOREIGN PATENT DOCUMENTS 2 265 277 9/1993 (GB) .
2 268 026 12/1993 (GB) .
2 279 846 1/1995 (GB) .

* cited by examiner

*Primary Examiner*—Forester W. Isen
*Assistant Examiner*—Brian Tyrone Pendleton
(74) *Attorney, Agent, or Firm*—Frommer Lawrence & Haug, LLP.; William S. Frommer; Glenn F. Savit

(57) ABSTRACT

In recording for example classical music played by an orchestra (O), a stereo pair (1) is used. To enhance say a quiet instrument such as a flute (F) a spot microphone (2) is used close to the flute. However, the different air-path lengths for the flute to the stereo pair (1) and spot microphone (2) creates undesired effects. The signal from the spot microphone is delayed (4), the delay being automatically controlled by an adaptive filter (5). The filter (5) correlates the spot microphone signal with the signal from the stereo pair to establish the delay time.

An alternative arrangement uses an adaptive filter trained by the signal from the spot microphone to extract the flute signal from the stereo pair.

In other arrangements, similar techniques are used to cancel undesired noise.

19 Claims, 8 Drawing Sheets

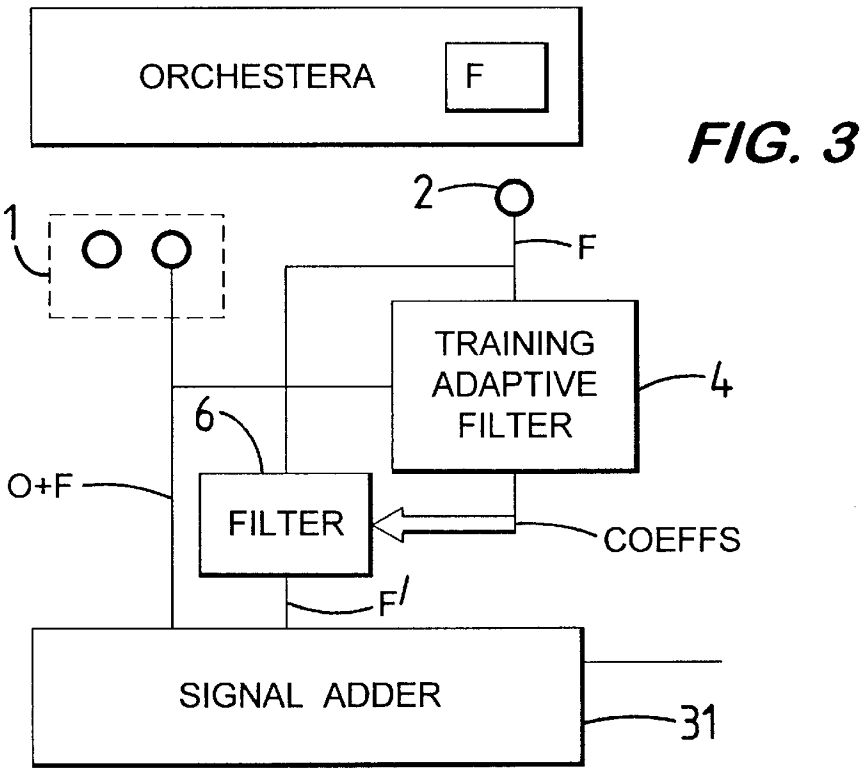
FIG. 3
FIG. 4
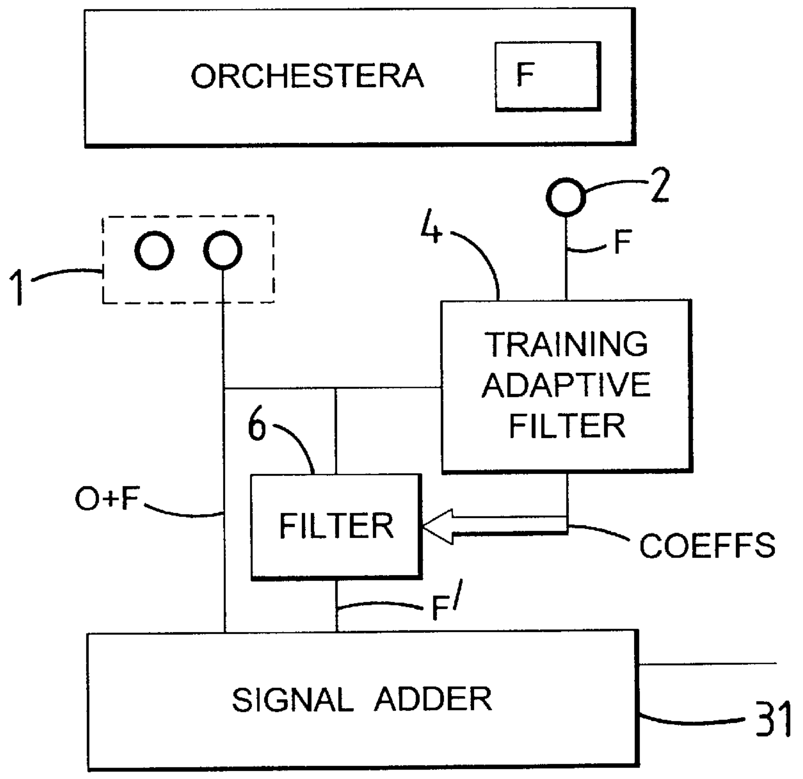

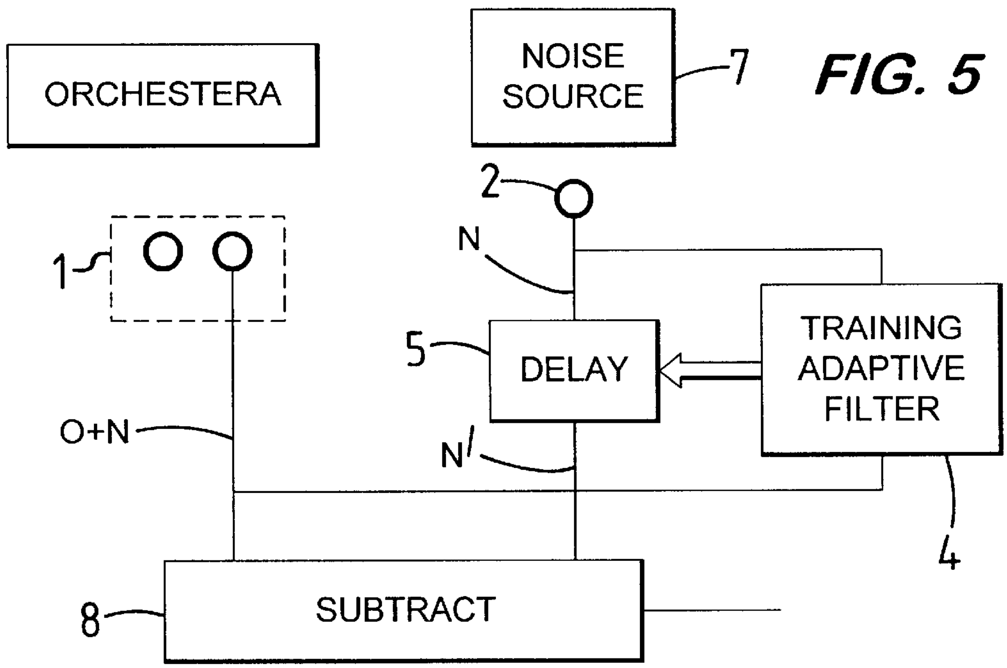
FIG. 5
FIG. 6
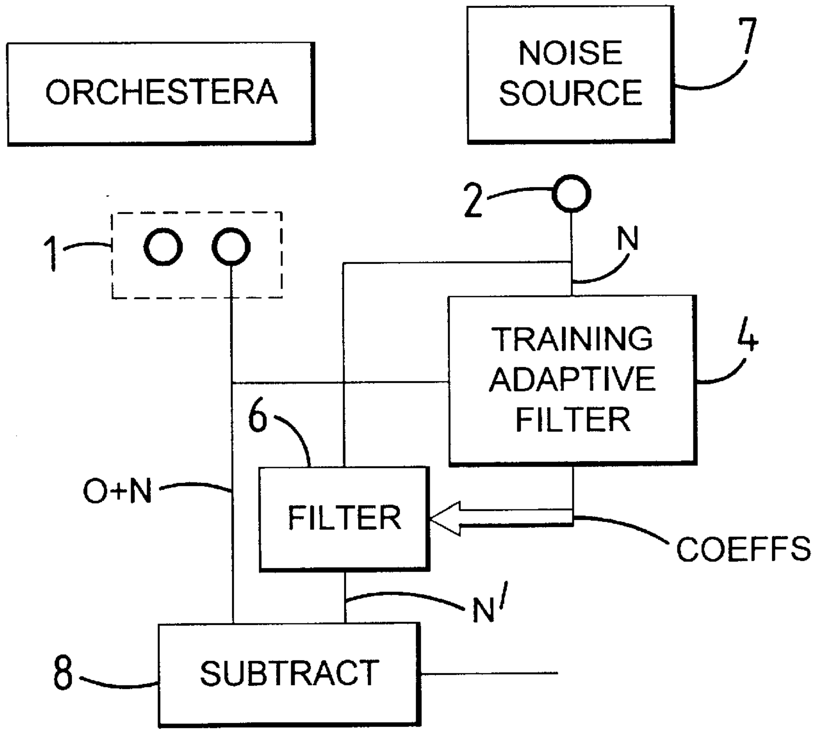

AUDIO SIGNAL PROCESSORS

BACKGROUND OF THE INVENTION

1. Field of the Invention

The present invention relates to audio signal processors. Illustrative embodiments of the invention relate to audio mixing consoles, especially digital audio mixing consoles.

2. Description of the Prior Art

Consider the illustrative arrangement shown in FIG. 1. A stereo musical recording of an orchestra playing classical music is made using a 'stereo pair' 1 of two identical directional microphones placed as close together as possible in a good listening position.

It is often necessary to increase the loudness of some component of the performance such as a voice or a quiet instrument. In FIG. 1 a flute F in the orchestra is shown as an example. The established method of doing this is to position a spot microphone 2 as close as possible to the flute and add the output of the microphone to the left and right channels of the stereo signal in some controllable proportions, using a stereo mixing console 3.

That method creates several problems because the path lengths through the air from the flute to the spot microphone 2 and to the stereo pair 1 are different. The flute signal derived from the spot microphone applied to the left and right stereo channels has a different timing to the same signal derived from the stereo pair.

This, in all cases, creates a filtering effect because at some frequencies the signals add, and others they subtract, due to the phase differences created by the differing air-path lengths. That creates an unwanted comb-filtering effect.

In addition, in general, the flute signal arrives at spot microphone 2 earlier than the flute signal at the stereo pair 1. The ear responds to the first signal to reach it (not the loudest signal) to fix the position of a stereo audio image. Thus the flute signal derived from the spot microphone can create an incorrectly positioned stereo image. To manually adjust the amplitude and delay of the spot signal is a skilled, difficult, task.

SUMMARY OF THE INVENTION

According to the present invention there is provided an audio signal mixing console comprising: a first input for receiving a first audio signal including first and second components representative of first and second sound sources; a second input for receiving a second audio signal representative of the second sound source; adaptive FIR filter means having a reference input for receiving one of the first and second audio signals as a reference signal, an operand input for receiving the other of the said audio signals as an operand signal, the adaptive filter means including means correlating the operand signal with the reference signal to generate a set of FIR coefficients associated with minimum correlation error between the reference and operand signals; means for processing the operand signal according to the coefficients; and means for combining the first audio signal with the processed operand signal.

Thus by using an adaptive filter to correlate the first signal (e.g the mixed signal from the stereo pair) with the second signal (e.g. the spot signal from the spot microphone), signals which are appropriately matched are automatically produced. The signals may be additively mixed for greater emphasis of the second signal. The signals may be subtracted to cancel the second signal: this is useful to cancel noise signals.

The processing means may be a delay device for delaying the second signal to match the timing of the first signal. The processing means may be an FIR filter which matches the phase and amplitude of the second signal to the second component of the first signal or extracts the second component from the first signal.

In a stereo mixing console having left and right channels, there may be an adaptive filter and a processing means for each channel. Alternatively, and preferably, there may be a processing means for each channel, and one adaptive filter shared by the channels.

BRIEF DESCRIPTION OF THE DRAWINGS

The above and other objects, features and advantages of the invention will be apparent from the following detailed description of illustrative embodiments which is to be read in connection with the accompanying drawings, in which:

FIGS. 2 to 4 are schematic block diagrams of embodiments of audio signal mixing systems according to the invention;

FIGS. 5 to 7 are schematic block diagrams of embodiments of noise cancellation systems according to the invention;

DESCRIPTION OF THE PREFERRED EMBODIMENTS

All embodiments of the invention described herein operate on digital audio signals. It is assumed that the microphones 1 and 2 referred to herein include analogue to digital converters.

Embodiments of the invention will now be described with reference to FIGS. 2 to 4, in which a stereo pair 1 produces audio signals (O+F) from an orchestra including a flute F, and a spot microphone 2 close to the flute F produces an audio signal F from substantially only the flute.

Figure 1:
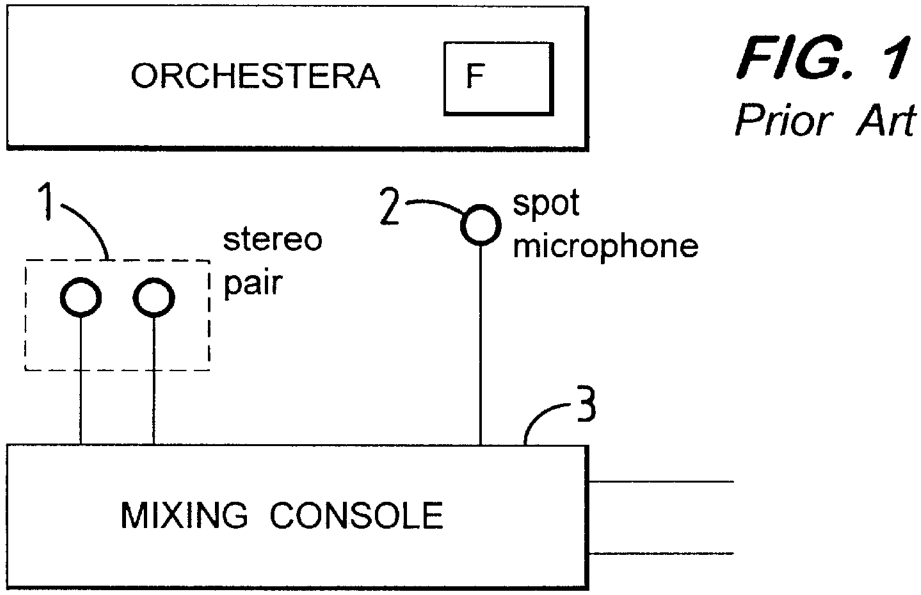
FIG. 1 Prior Art
FIG. 1 is a schematic block diagram of a known audio signal mixing system.
Figure 2:
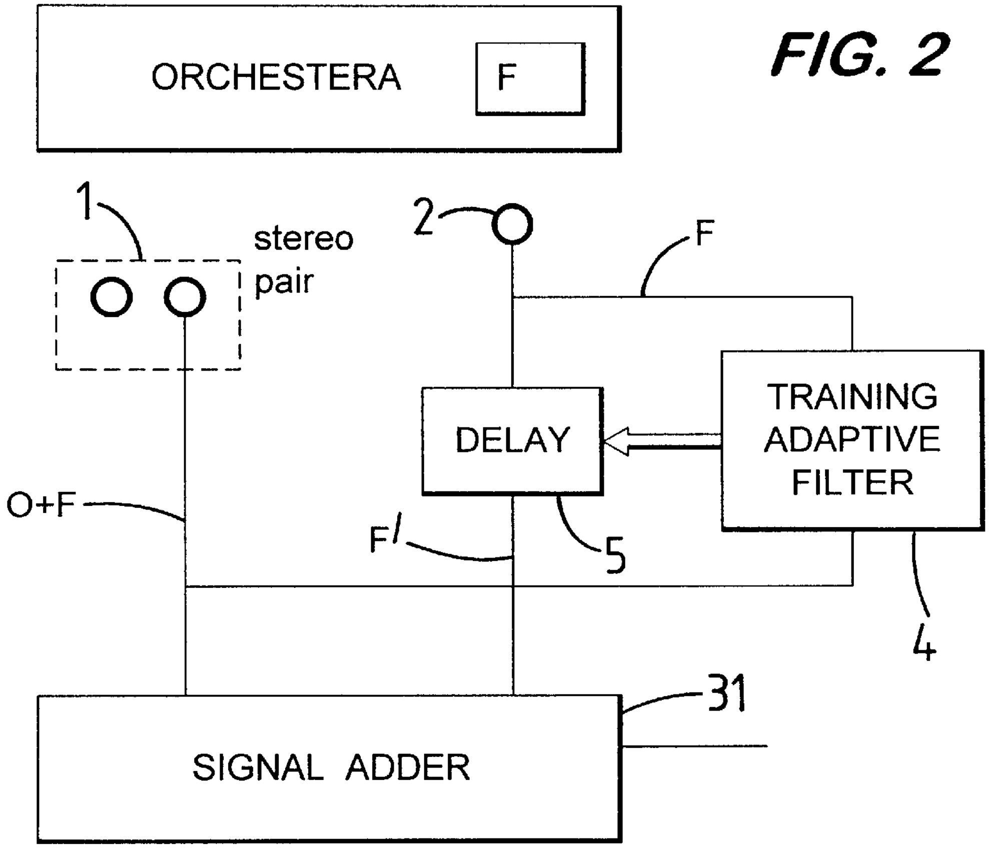

In FIGS. 2 to 4 only one channel of the stereo pair is considered. A similar arrangement is used for the other channel.

In the embodiment of FIG. 2, a delay 5 applied to the flute signal F is adjusted so that the flute signal is delayed by the same amount as if it were detected by the stereo pair. The delay is controlled by an adaptive filter 4 which receives the flute signal F as an operand signal and also receives the mixed signal O+F as a reference signal. It correlates the reference signal O+F with the flute signal F, to determine the delay to be applied to signal F to match the delay in the corresponding component F' the signal O+F.

In short the embodiment of FIG. 2 processes the signal F from the spot microphone 2 so that it becomes what it would have been if picked-up by the stereo pair 1. The processed signal F' is then combined in desired manner with the stereo pair signal O+F in an additive signal mixer 31.

FIG. 3 uses the signal F from the spot microphone, processing it in an adaptive filter arrangement 4 so that it matches the phase and amplitude of the corresponding signal component in the mixed signal O+F.

For this purpose the mixed signal O+F from the stereo pair 1 is used as a reference signal. The signal F from the spot microphone and the reference signal are applied to an adaptive filter 4 which correlates the signal F (as an operand signal) with the reference signal, generating a set of filter coefficients. The filter coefficients produced by the adaptive filter 4 are the coefficients of a filter which processes the signal F so that it matches the corresponding component of the signal O+F. These coefficients are transferred to a filter 6 which so processes the signal F. Thus the adaptive filter 4 trains the filter 6. The processed signal F' derived from the spot microphone is combined with the mixed signal O+F in an additive signal mixer 31.

In the embodiment of FIG. 4, the signal F from the spot microphone is the reference signal. It is used to extract, from the mixed signal O+F (as the operand signal), the corresponding component F'. The component F' extracted from the mixed signal is then combined with the mixed signal in the signal mixer 31.

For this purpose an adaptive filter 4 receives the reference signal F from the spot microphone 2 and correlates it with the mixed signal (O+F) from the stereo pair 1 to produce a set of coefficients which are the coefficients of a filter which would extract the component F' corresponding to F from O+F. The coefficients are transferred to a filter 6 which extracts F' from the signal O+F. The extracted component F' is then added to O+F in an additive signal mixer 31.

Figure 7:
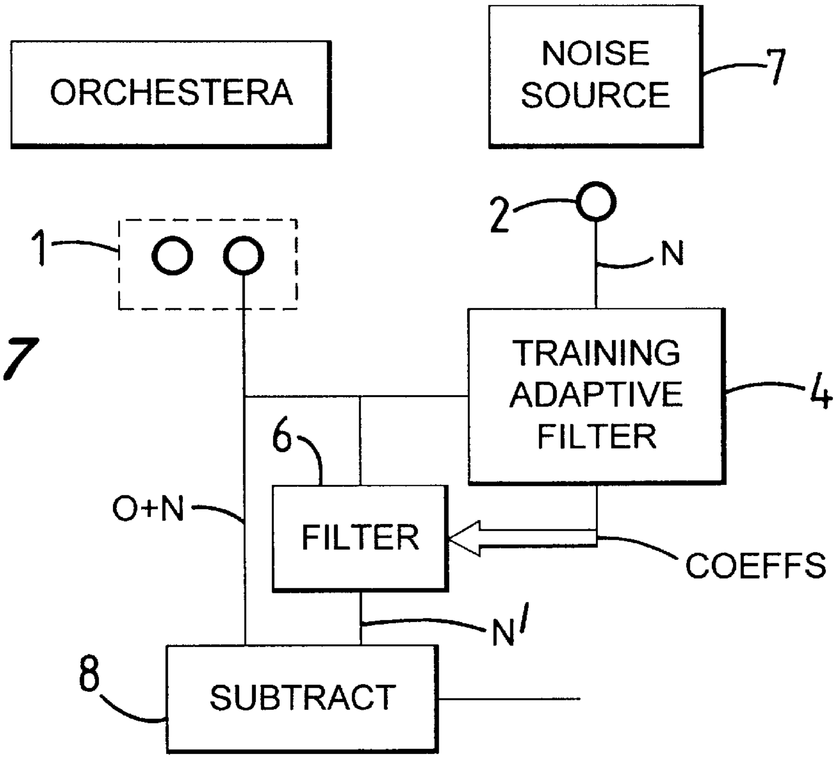

FIGS. 5 to 7 shows noise cancellation systems, corresponding to and operating on the same principles as FIGS. 2 to 4. The only fundamental difference is that the noise cancellation systems have a signal subtracter 8 instead of an additive signal mixer 31.

Referring to FIG. 5, there is shown schematically a recording studio containing an orchestra O, a stereo pair 1, a source 7 of unwanted noise N such as an air conditioning unit, and/or a fluorescent lamps amongst other possibilities, and a spot microphone 2 which produces a signal N representing the noise.

The signal from the stereo pair is a mixed signal containing a music component O from the orchestra and the noise component N. The mixed signal O+N is applied as a reference signal to an adaptive filter 4 which correlates the noise signal N with the reference signal to determine the delay to be applied to the noise-signal so that it matches the timing of the noise component N of the mixed signal. The noise signal N is then delayed 5 and subtracted 8 from the mixed signal O+N to cancel the noise therein.

FIG. 6 corresponds to FIG. 3. In this version the noise signal N is used to train a filter 6 in which the noise signal N from the spot microphone 2 is processed to match the corresponding component N picked up by the stereo pair 1. The processed noise component $N^1$ from the spot microphone is subtracted from the mixer signal 0+N in a subtracter 8 to cancel the noise component.

FIG. 7 corresponds to FIG. 4. The noise signal N is used to train a filter 6 to extract the noise component from the mixed signal O+N. The extracted noise component $N^1$ is subtracted from the mixed signal O+N to cancel the noise component.

Figure 8A:
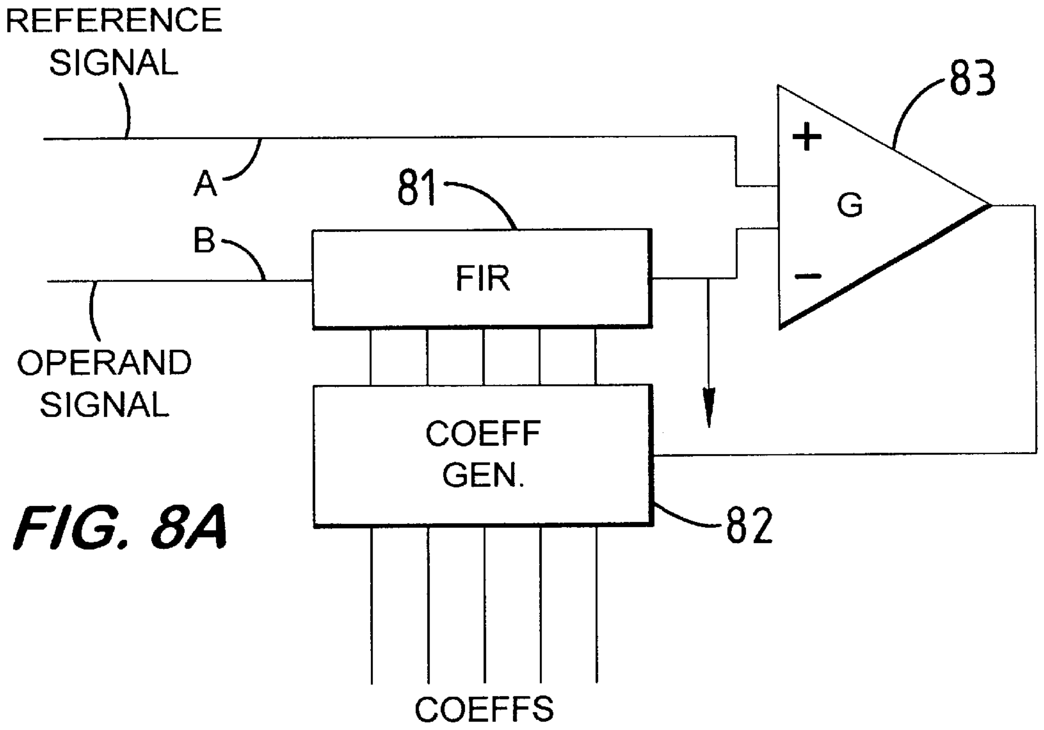
FIG. 8A is a block diagram of an adaptive filter useful in the systems of FIGS. 2 to 7.
Figure 8B:
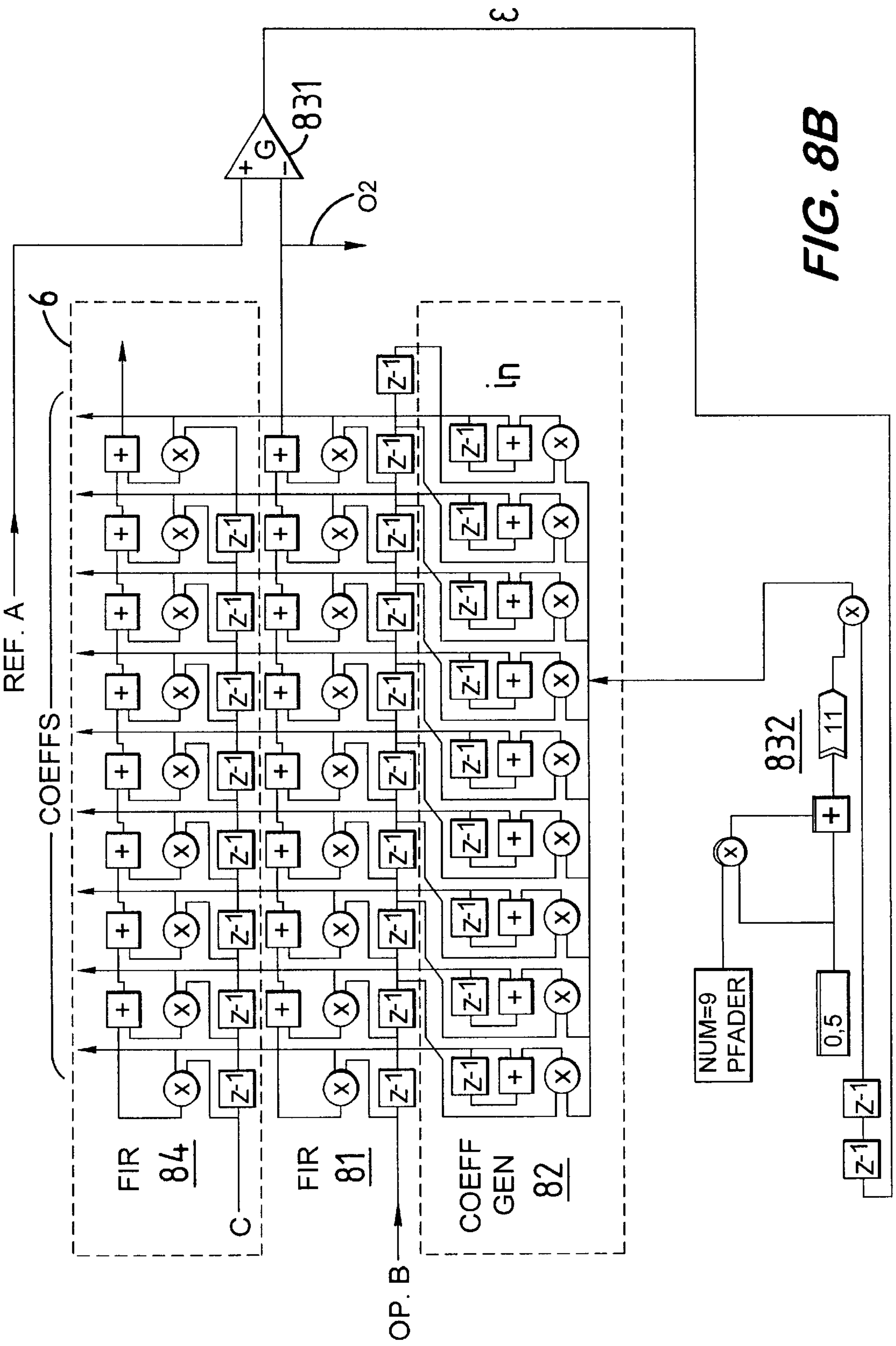
FIG. 8B is a detailed block diagram of the adaptive filter of FIG. 8A.

FIG. 8A is a schematic block diagram of the training adaptive filter 4 of FIGS. 2 to 7. A detailed diagram of a version of the filter is shown in FIG. 8B.

In FIG. 8A an input A receives a reference signal.

An FIR filter 81 has an input B for receiving an operand signal.

The FIR filter 81 filters the operand signal according to an FIR characteristic defined by a set of coefficients supplied to it.

The filtered operand signal produced by the second filter 81 is compared with the reference signal in a comparator 83 having a gain G to produce an error signal $\epsilon$.

A coefficient generator 82 generates the coefficients by correlating the error signal $\epsilon$ with the operand signal.

It is evident that if the filtered operand signal exactly matches the reference signal, then the error is zero. In practice, the error is minimised.

Referring to FIG. 8B, FIR filter 81 comprises, as is well known, a series of delay stages $Z^{-1}$ which delay samples of the input signal, a plurality of weighting circuits X which weight the samples of the input signal A or B by respective coefficients, and adders+which form the sum of the weighted samples to produce a filtered signal.

The coefficients of the filter 81 are produced by the coefficient generator 82.

The filtered signals A and B are compared in the comparator 831 to produce the error signal $\epsilon$ which is supplied by a gain and phase adjustment circuit to 832 to the coefficient generator. The adjustment circuit is provided to ensure stable operation of the filter.

The coefficient generator 82 has a plurality of stages n each comprising a multiplier which multiplies the error signal $\epsilon_n$ with a sample $B_n$ of the operand signal from a corresponding stage of the second filter 81 to form the product $\epsilon_n.B_n$. The product is integrated over time by an integrator ($i_n$) comprising an adder+and a delay stage $z^{-1}$ (as indicated at $i_n$ for one stage), to form a coefficient $$Cn=\int\epsilon_n.B_n dt$$

The set of coefficients Cn may be transferred to the filter 6 of FIG. 3, 4, 6 in or 7 as indicated by FIR, filter 84, of FIG. 8B.

Alternatively, it is evident that FIR filter 84 is identical to FIR filter 81 of FIG. 8B. Thus the output of filter 81 may by used directly, filter 81 acting as both part of the adaptive filter 4 and as the operand signal filter 6.

Figure 11:
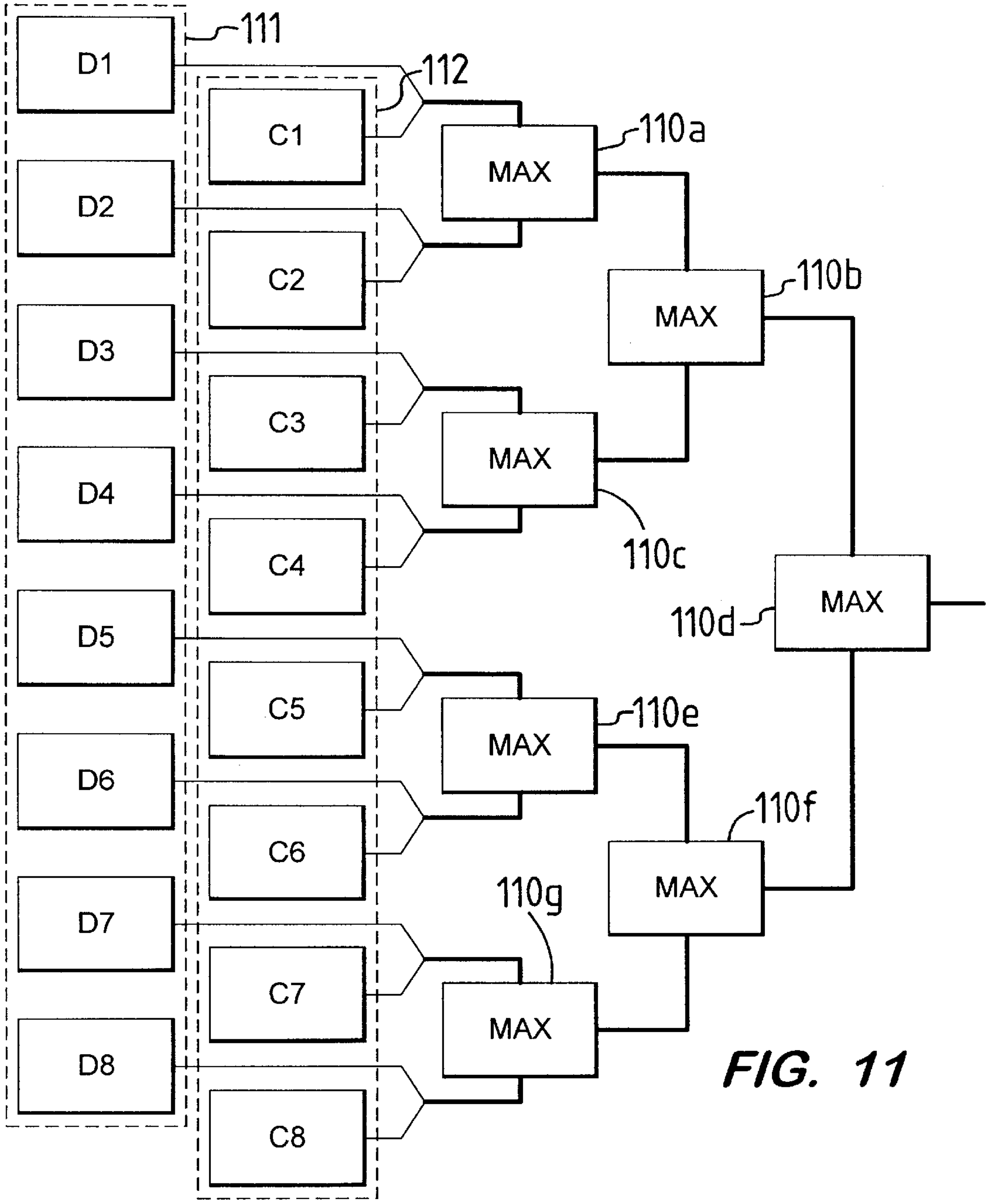
FIGS. 11 and 12 are block diagrams of parts of a circuit for determining a delay value.
Figure 12:
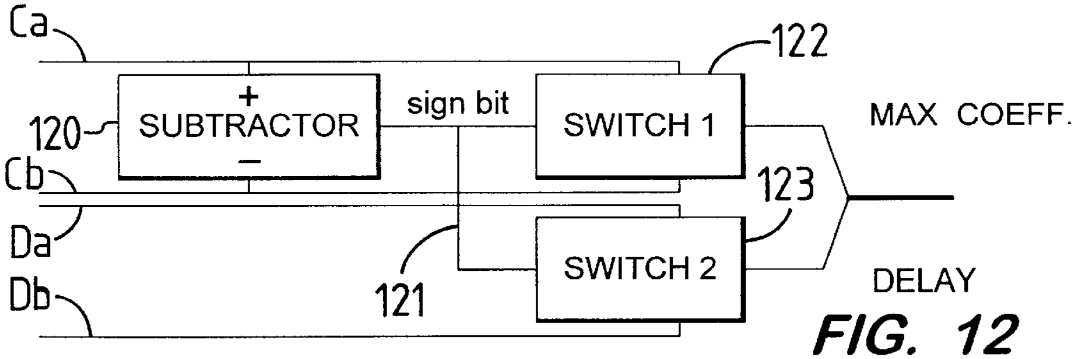

The coefficients Cn represent the impulse response of the filter. When the adaptive filter is used with the delay circuit 5 of FIG. 2 or 5, the delay may be determined from the maximum value of the impulse response; i.e. the coefficient of largest value. In practice the response may need averaging over a small number of coefficients to avoid the delay being incorrectly determined by an isolated maximum in the response. An example of a circuit for determining the delay is shown in FIGS. 11 to 13 which are described herein below.

Figure 9:
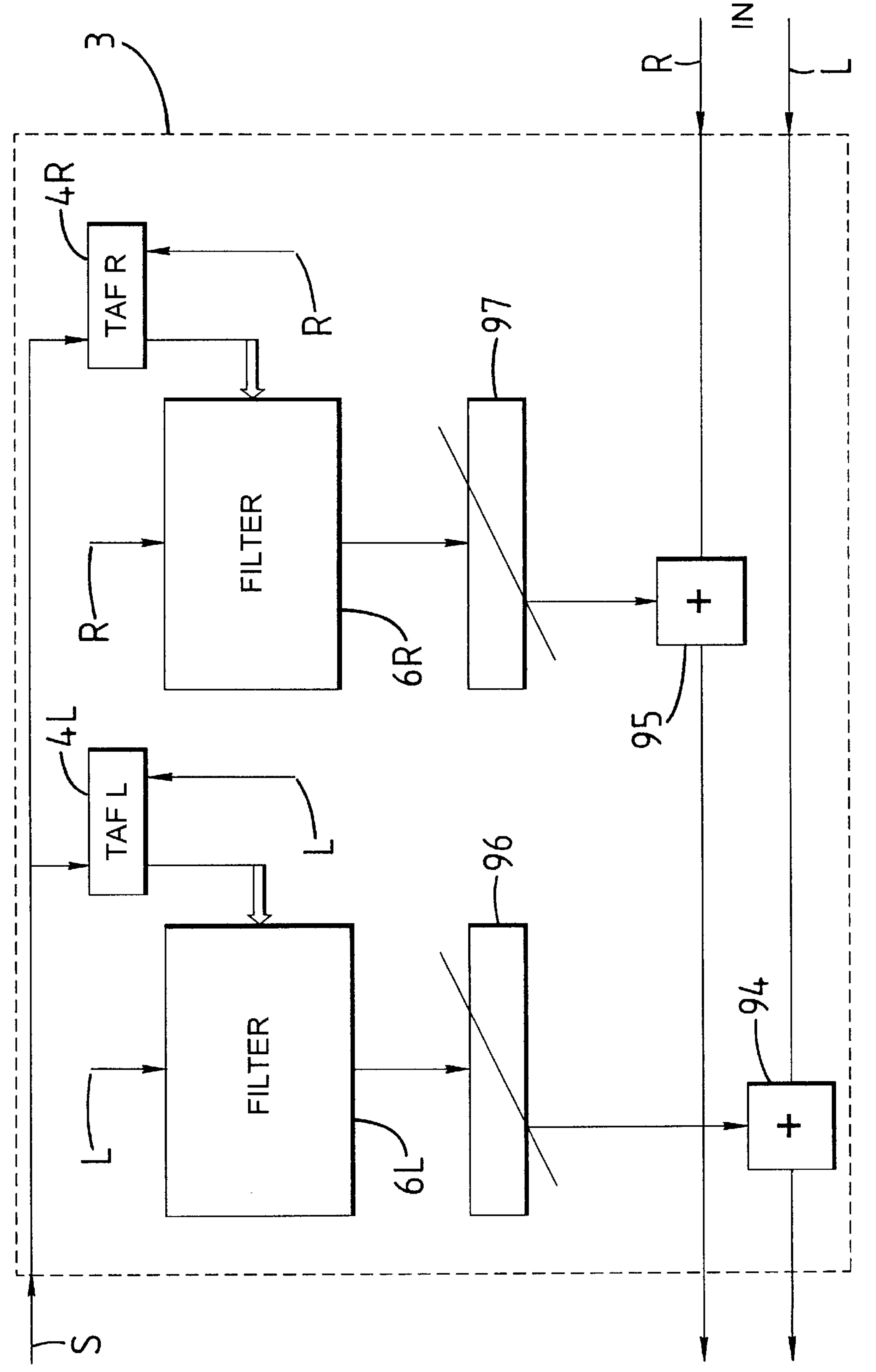
FIG. 9 is a block diagram of another embodiment of an audio signal mixing system according to the invention.

FIG. 9 shows one embodiment of a simple stereo mixing console 3 according to the invention.

In this embodiment, there are two channels R (right) and L (left) which have R and L inputs for receiving signals from the stereo pair 1 (not shown). In addition an input S is for receiving signals from the spot microphone 2 (not shown).

Each channel R, L, has an adaptive filter channel comprising an adaptive filter 4R, 4L a filter 6R and 6L corresponding to the adaptive filter 4 and filter 6 of FIGS. 2 to 7 and optionally a gain device 96, 97. In the embodiment of FIG. 9, the spot signal is the reference signal, and the audio signal R, L from the stereo pair is the operand signal.

The adaptive filter 4R, 4L continuously produces coefficients which are fed to the filter 6R, 6L to extract from the operand signal the component matching the reference signal. The extracted component is then fed to an adder 94,95 for mixing optionally via the variable gain device 96, 97.

The variable gain device 96,97 allows the relative proportions of the stereo pair signal and the extracted component in the mixed signal to be varied.

The embodiment of FIG. 9 may be modified in various ways. The spot signals may be the operand signal and the stereo pair signal may be the reference signal. The filter 6 may be replaced by a delay when the spot signal S is the operand signal.

A mixing console may comprise many more than two adaptive filtering channels, at least some of which are as shown in FIG. 9.

Figure 10:
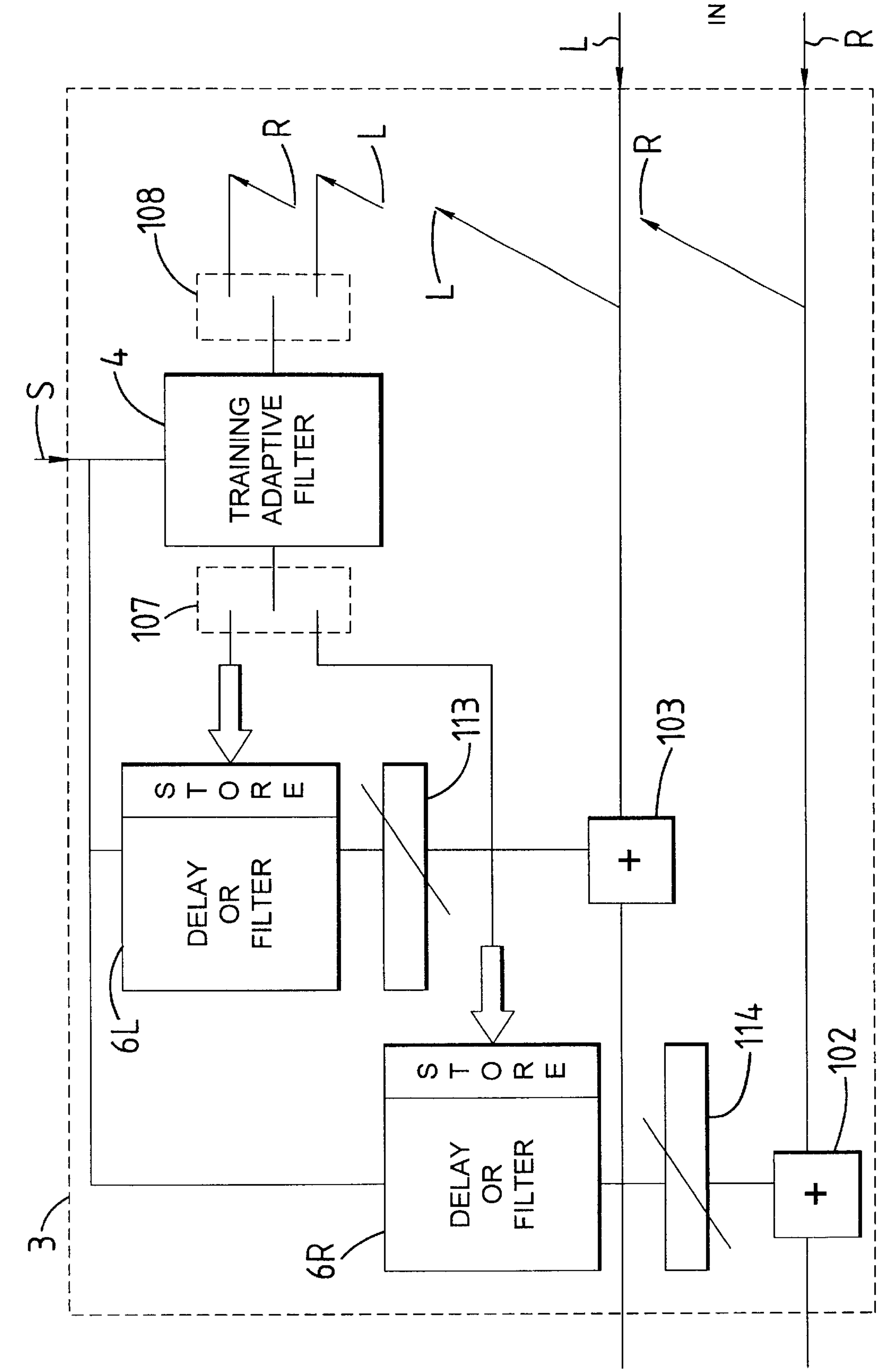
FIG. 10 is a block diagram of a further embodiment of an audio signal mixing system according to the invention.

The embodiment of FIG. 10 is another mixing console according to the invention.

There are two channels R (right) and L (left) which have R and L inputs for receiving audio signals from the stereo pair 1 (not shown). An input 5 is provided for receiving a spot signal from the spot microphone 2 (not shown).

Each channel R and L has a filter 6R and 6L coupled to an adder 102,103 via a variable gain device 113,114. Thus the embodiment of FIG. 10 is similar to the embodiment of FIG. 9. However there is only one adaptive filter 4.

The embodiment of FIG. 10 has two modes of operation:

(i) a first, training, mode in which the adaptive filter 4 trains the filters 6R and 6L and (ii) a second, operational, mode in which the trained filters 6R, 6L process the operand signal independently of the adaptive filter 4.

It is preferred that the embodiment of FIG. 10 is used with a multitrack recording of the audio sources. In the training mode, the adaptive filter 4 is first connected to, say, the right channel R by the switches 107,108 to train the filter 6R in response to the spot signal S as the operand signal and the right channel audio signal R as the reference signal. The recording is then played-back to produce the set of coefficients for the filter 6R, the filter including a store for storing the coefficients. The adaptive filter 4 is then connected to the left channel and the recording is then replayed to produce a set of coefficients, which are stored in the filter 6L.

Once the filters are trained, the recording is again played back to provide the filtered signals which are mixed by the mixer.

Various modifications may be made to the embodiment of FIG. 10. The filters 6R and 6L maybe replaced by delay devices when the spot signal is the operand signal. The reference signal may be the spot signal 5 and the operand signal may be the Right or left channel signal. A mixing console may comprise many more than two adaptive filtering channels, at least some of which are as shown in FIG. 10.

Referring to FIGS. 11 and 12, there is shown block diagrams of parts of an illustrative circuit for determining a delay value from coefficients a to h produced by the coefficient generator 82 of FIG. 8B. FIG. 11 operates on 8 coefficients a to h only as an example. There may be other numbers of coefficients depending on the desired accuracy of the delay.

The delay value is determined from the position, in the FIR filter of FIG. 8B, of the largest coefficient. As discussed above the coefficients may be subject to an averaging process to reduce the effects of isolated large coefficients unrepresentative of the correct delay value.

Referring to FIG. 11, pairs of coefficients Cn, Cn+1 stored in a register 112 are compared in MAX elements 110*a, c, e* and *g.* Each MAX element has one pair of inputs for receiving the coefficients Cn, Cn+1 to be compared and another pair of inputs for receiving associated delay values Dn, Dn+1 which are stored in a register 111 in the same order as the associated coefficients, a first output for the largest coefficient and a second output for the delay value associated with the largest coefficient. Each MAX element switches to its first output the larger of the compared coefficients and switches to its second output the associated delay value. The coefficients output by pairs of the MAX elements are compared in further MAX elements 110*b* and 110*f* and the coefficients output by those elements are compared in a MAX element 110*g*. Thus element 110*g* outputs the largest, M, of the coefficients and its associated delay value.

FIG. 12 illustrates a MAX element of FIG. 11. It comprises a subtracter 120 which compares two coefficients, e.g. C<u>a</u> and C<u>b</u>. The sign bit on output 121 is "one" if Ca>Cb and zero is Cb>Ca. A switch 122 responsive to the sign bit switches C<u>a</u> to its output if the sign bit is "one" and switches C<u>b</u> to its output if the sign bit is zero. Likewise a second switch 123 receives the delay values Da and Db associated with Ca and Cb and switches to its output the delay value associated with the larger of the two compared coefficients.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

What is claimed is:

1. An audio signal mixer comprising:

a first input for receiving a first audio signal including first and second components representative of first and second sound sources;

a second input for receiving a second audio signal representative of the second sound source;

adaptive FIR filter means having a reference input for receiving one of the first and second audio signals as a reference signal, an operand input for receiving the other of the said audio signals as an operand signal, the adaptive filter means including means correlating the operand signal with the reference signal to generate a set of FIR coefficients associated with minimum correlation error between the reference and operand signals;

means for processing the operand signal according to the coefficients; and means for combining the first audio signal with the processed operand signal.

2. A mixer according to claim 1, wherein the operand signal is the second audio signal.

3. A mixer according to claim 2, wherein the processing means filters the second audio signal according to the said coefficients to match the phase and amplitude of the second component of the first audio signal.

4. A mixer according to claim 1, wherein the operand signal is the first audio signal.

5. A mixer according to claim 4, wherein the processing means (6) filters the first audio signal according to the said coefficients to derive therefrom the second audio component.

6. A mixer according to claim 1, wherein the combining means additively combines the first audio signal with the processed operand signal to produce a resultant output signal that is representative of a combination of said first and second sound sources.

7. A mixer according to claim 1 wherein the combining means subtractively combines the first audio signal with the processed operand signal to produce a resultant output signal that is representative of only one of said first and second sound sources.

8. A mixer according to claim 1, including a plurality of the said first inputs for receiving respective first audio signals each including first and second components representative of first and second sound sources, a respective plurality of the said adaptive filter means, and a respective plurality of the said processing means and a respective plurality of the said combining means.

9. A mixer according to claim 1, including a plurality of the said first inputs for receiving respective first audio signals each including first and second components representative of first and second sound sources, a respective plurality of the said processing means and a respective plurality of the said combining means, and switching means for selectively connecting the adaptive filter means to the said first inputs and to the said processing means.

10. A mixer according to claim 9, wherein the processing means includes storing means for storing the coefficients defining the processing of the operand signal, the coefficients signals being determined during a training phase of operation of the mixer.

11. A mixer according to claim 1, wherein the adaptive filter means comprises an FIR filter having an input for receiving the operand signal to produce an operand signal filtered according to a set of FIR coefficients means for comparing the filtered operand signal with the reference signal to produce an error signal and coefficient generating means for correlating the error signal with the filtered operand signal to generate the said set of FIR coefficients.

12. A mixer according to claim 11, wherein: the said FIR filter comprises a plurality of delay stages connected in series with the input for receiving the operand signals (S) to produce delayed operand signals ($S_n.z^{-n}$) and means for forming the sum of the outputs $\Sigma C_n.(S_n.z^{-n})$ of the delay stages weighted according to the said coefficients (Cn) the said sum being the filtered operand signal;

and the coefficient generating means comprises a plurality of delay stages connected in series to receive the error signal ($\epsilon$) to produce delayed error signals ($\epsilon_m z^{-m}$), and means for forming the integral over time of the product of the delayed operand signals and the delayed error signals $$\int_{t1}^{t2} \epsilon_m z^{-m}.S_n z^{-n} dt$$

as the said set of FIR coefficients.

13. A mixer according to claim 1, wherein at least one of said first and second sound sources is a non-noise sound source, and said means for combining the first audio signal with the processed operand signal produces a combined signal that is representative of at least one of said first and second sound sources.

14. An audio signal mixer comprising:

a first input for receiving a first audio signal including first and second components representative of first and second sound sources;

a second input for receiving a second audio signal representative of the second sound source;

an adaptive FIR filter having a reference input for receiving one of the first and second audio signals as a reference signal, an operand input for receiving the other of the audio signals as an operand signal, the adaptive filter including means correlating the operand signal with the reference signal to generate a set of FIR coefficients associated with minimum correlation error between the reference and operand signals;

a delay device, separate from the adaptive FIR filter, for delaying the operand signal by a delay time determined from the FIR coefficients to match the phase and amplitude of the second component of the first audio signal; and a combiner for combining the first audio signal with the delayed operand signal.

15. A mixer according to claim 14, wherein at least one of said first and second sound sources is a non-noise sound source, and said combiner produces a resultant output signal that is representative of at least one of said first and second sound sources.

16. A mixer according to claim 14, wherein the combiner additively combines the first audio signal with the delayed operand signal to produce an output signal that is representative of a combination of said first and second sound sources.

17. A mixer according to claim 14, wherein the combiner subtractively combines the first audio signal with the delayed operand signal to produce an output signal that is representative of only one of said first and second sound sources.

18. A method for mixing audio signals, comprising:

receiving a first audio signal having first and second components representative of first and second sound sources;

receiving a second audio signal representative of substantially the second sound source;

performing an adaptive filtering operation by receiving one of the first and second audio signals as a reference signal, receiving the other of the audio signals as an operand signal, and correlating the operand signal with the reference signal to generate a set of FIR coefficients associated with minimum correlation error between the reference and operand signals;

processing the operand signal according to the FIR coefficients; and combining the first audio signal with the processed operand signal.

19. A method according to claim 18, wherein said step of processing the operand signal according to the FIR coefficients comprises delaying the second signal by a delay time determined from the FIR coefficients to match the phase and amplitude of the second component of the first audio signal.

* * * * *